(12) United States Patent
Dan et al.

(10) Patent No.: US 11,061,451 B2
(45) Date of Patent: Jul. 13, 2021

(54) SELF-ADAPTIVE VENTS

(71) Applicant: Microsoft Technology Licensing, LLC, Redmond, WA (US)

(72) Inventors: Bo Dan, Redmond, WA (US); James David Wahl, Woodinville, WA (US); Chau Van Ho, Des Moines, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 487 days.

(21) Appl. No.: 15/422,180

(22) Filed: Feb. 1, 2017

(65) Prior Publication Data

US 2018/0217644 A1 Aug. 2, 2018

(51) Int. Cl.
*G06F 1/20* (2006.01)
*H05K 7/20* (2006.01)

(52) U.S. Cl.
CPC .............. *G06F 1/206* (2013.01); *G06F 1/203* (2013.01); *H05K 7/20145* (2013.01); *H05K 7/20172* (2013.01); *H05K 7/20181* (2013.01); *H05K 7/20836* (2013.01)

(58) Field of Classification Search
CPC ..... G06F 1/206; G06F 1/203; H05K 7/20145; H05K 7/20172; H05K 7/20181
See application file for complete search history.

(56) References Cited

U.S. PATENT DOCUMENTS

| | | | |
|---|---|---|---|
| 4,752,216 A | 6/1988 | Hurrell | |
| 5,410,448 A | 4/1995 | Barker et al. | |
| 6,375,528 B1 | 4/2002 | Neisen | |
| 7,214,131 B2 | 5/2007 | Malone | |
| 7,360,534 B2 | 4/2008 | Krupp | |
| 8,515,589 B2 | 8/2013 | Haugh et al. | |
| 8,637,792 B2 | 1/2014 | Agnello et al. | |
| 2006/0072287 A1* | 4/2006 | Kwong | G06F 3/0231 361/679.08 |
| 2006/0094347 A1* | 5/2006 | Tracy | G06F 1/206 454/184 |
| 2007/0289589 A1 | 12/2007 | McFarland | |
| 2008/0218969 A1 | 9/2008 | Muraki | |
| 2009/0092261 A1 | 4/2009 | Bard | |
| 2010/0167636 A1 | 7/2010 | Bhattacharya et al. | |

(Continued)

FOREIGN PATENT DOCUMENTS

| | | |
|---|---|---|
| CA | 2826476 A1 | 8/2012 |
| CN | 104951028 A | 9/2015 |

(Continued)

OTHER PUBLICATIONS

Suzuki et al., Information Processing Apparatus, Jun. 29, 2006, JP2006172269A, Whole Document (Year: 2006).*

(Continued)

*Primary Examiner* — Larry L Furdge
(74) *Attorney, Agent, or Firm* — Ray Quinney & Nebeker P.C.; Paul N. Taylor (57) ABSTRACT

Thermal management devices and systems, and corresponding methods of cooling an electronic device are described herein. A method for cooling an electronic device that includes a housing and a vent in the housing includes monitoring, by a sensor, an operating condition of the electronic device. The vent is opened or closed based on the monitored condition of the electronic device.

16 Claims, 6 Drawing Sheets

(56) References Cited

U.S. PATENT DOCUMENTS

| | | |
|---|---|---|
| 2012/0130545 A1 | 5/2012 | Haugh et al. |
| 2014/0108832 A1* | 4/2014 | Yamaguchi ............. G06F 1/203 |
| | | 713/320 |
| 2014/0244046 A1 | 8/2014 | Zhou et al. |
| 2015/0322955 A1 | 11/2015 | Bapseres |
| 2016/0040904 A1 | 2/2016 | Zhou et al. |
| 2016/0107501 A1 | 4/2016 | Johnston |
| 2016/0165753 A1 | 6/2016 | Larsen et al. |

FOREIGN PATENT DOCUMENTS

| | | |
|---|---|---|
| EP | 2096517 A2 | 9/2009 |
| JP | 2006172269 A * | 6/2006 |
| TW | M454069 U | 5/2013 |
| WO | 2016011040 A1 | 1/2016 |

OTHER PUBLICATIONS

"International Search Report and Written Opinion Issued in PCT Application No. PCT/US2018/015113", dated Jul. 11, 2018, 20 Pages.

"Greenhouse Vent Openers & Supplies", Retrieved on: Aug. 8, 2016 Available at: http://www.littlegreenhouse.com/accessory/vent2.shtml.

\* cited by examiner

SELF-ADAPTIVE VENTS

BRIEF DESCRIPTION OF THE DRAWINGS

For a more complete understanding of the disclosure, reference is made to the following detailed description and accompanying drawing figures, in which like reference numerals may be used to identify like elements in the figures.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. For forced convection, a computing device may include one or more fans used to move air through the computing device and cool one or more heat generating components of the computing device.

Thermal management systems of the prior art may use sensors to track temperatures within the computing device (e.g., corresponding to heat generating components within the computing device) and increase a speed of one or more of the fans when a tracked temperature approaches a temperature limit of the corresponding component within the computing device. Once fan speeds reach limits, airflow through the computing device is maximized, and one or more of the heat generating components within the computing device are throttled. In other words, system performance is reduced to maintain all temperatures within the computing device within limits. Further, the fan consumes more power when operating at the increased speed, and the increased fan speeds create a noisier thermal management system from, for example, moving fan blades and motor spinning/vibration; this results in a noisier computing device.

System impedance is a parameter of the computing device that impacts both cooling capacity and system noise. The higher the system impedance, the less airflow the fans of the computing device may provide. Less airflow leads to higher component and skin temperatures. To obtain a same airflow in a first computing device (e.g., a high impedance system) compared to a second computing device with a lower system impedance (e.g., a low impedance system), higher fan speeds are provided. This results in higher system noise compared to the second computing device.

Disclosed herein are apparatuses, systems, and methods for dynamically controlling vents (e.g., self-adaptive vents) in a computing device to control air flow through the computing device and/or minimize acoustic levels during operation of the thermal management system, while also providing optimal thermal management. To optimize (e.g., lower) the system impedance and minimally impact industrial design (ID) of the computing device, the vents are dynamically controlled (e.g., self-activated) based on one or more monitored operating conditions (e.g., temperature and/or fan speed) of the computing device.

The self-adaptive vents may be utilized to change the system impedance based on a configuration or mode of the computing device. For example, the configuration or mode of the computing device may allow for maximum vent opening without any negative impact to ID due to there being no line of sight for the user in such modes. Alternatively, the configuration or mode may choke venting in a first location and open adaptive vents in a second location that minimally affects ID to provide proper system airflow. For example, the second location may be on one or more surfaces of the computing device hidden to a user. The vents may be activated by rotating and/or sliding using mechanical and/or electromechanical mechanisms under defined usage conditions.

As an example of operation of the self-adaptive vents in particular configurations of the computing device, under low power usage conditions of the computing device, self-adaptive vents are deactivated (e.g., closed), thus minimally impacting the ID of the computing device. System temperatures and fan speeds are monitored and controlled by a processor (e.g., an embedded controller (EC)). Once component temperatures are over defined limits and the fans also reach corresponding maximum allowable speeds, the self-adaptive vents are activated (e.g. opened) to reduce the system impedance. By using the self-adaptive vents, system performance may be enhanced (e.g., increased processing rates) by the increase in airflow. Alternatively, part of the capability may be used to increase system performance, and part of the capability may be used to reduce system noise (e.g., decrease fan speed), or all of the capability may be used to reduce system noise.

The thermal management system controlled in this way provides optimal thermal management for the computing device and/or minimizes acoustics in the computing device. Optimal thermal management may provide an increase in system performance and an increase in computing device life expectancy.

As an example, the improved heat dissipation from an electronic device may be implemented by a method for cooling the electronic device, which includes a housing and a vent in the housing. The method includes monitoring, by a sensor, an operating condition of the electronic device, and opening or closing, by a processor, the vent based on the monitored condition of the electronic device.

Such heat dissipation apparatuses or systems have several potential end-uses or applications, including any electronic device to be cooled. For example, the heat dissipation apparatus may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, fans may be operated at a lower speed, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

Figure 1:
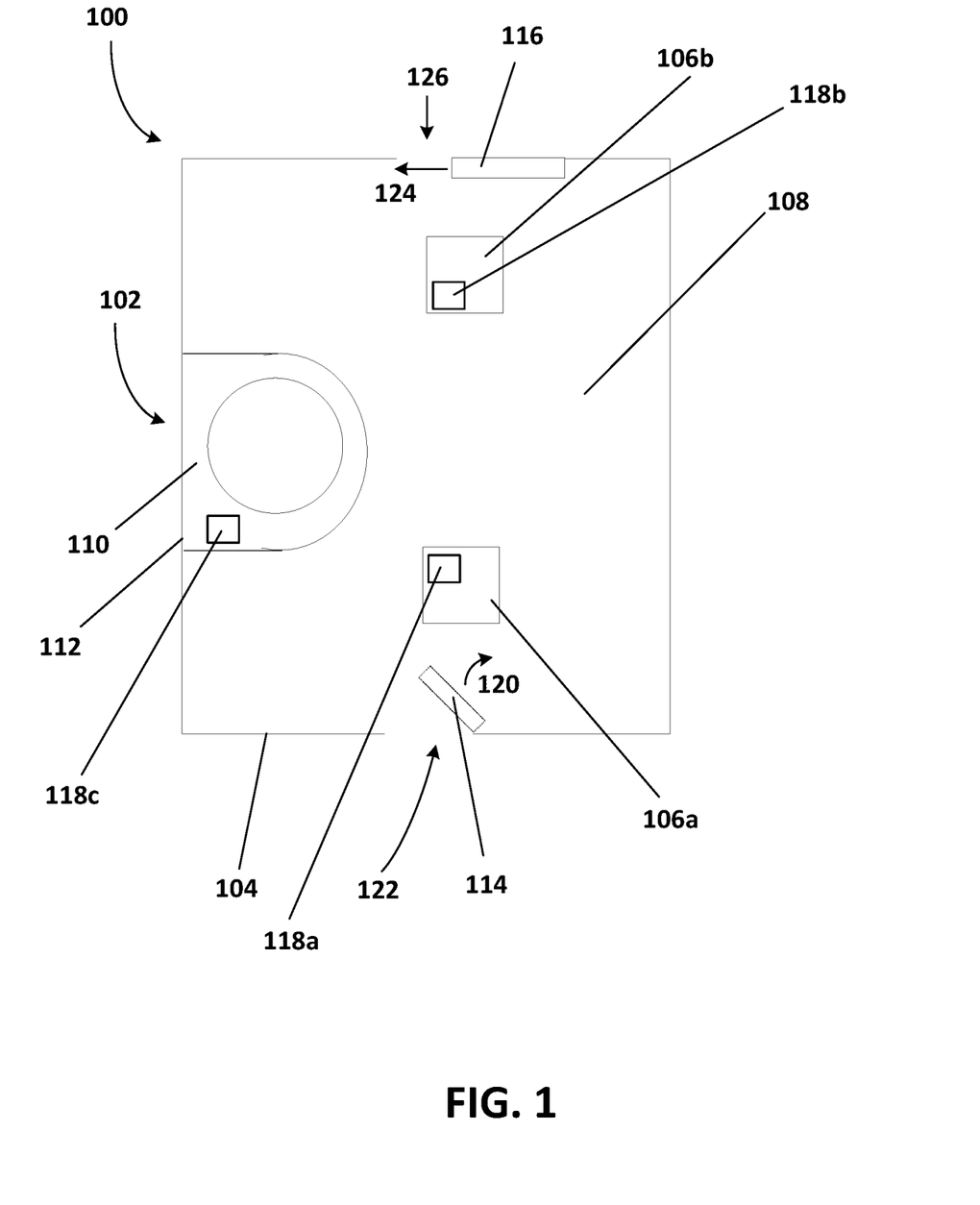
FIG. 1 depicts a top view of a computing device including an example of a thermal management system.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The computing device 100 includes a housing 104 that supports at least the thermal management system 102 and one or more heat generating components 106. The one or more heat generating components 106 may be any number of electrically powered devices including, for example, a processor, a graphics card, memory, a power supply, a hard drive, or another electrically powered device. The one or more heat generating components 106 may be supported by the housing 104 via, for example, a printed circuit board (PCB) 108 attached to and/or supported by the housing 104. The one or more heat generating components 106 are in communication with each other and/or other electrical devices or components (e.g., fans) of the computing device 100 via the PCB 108, for example. The computing device 100 may include a number of components not shown in FIG. 1 (e.g., a hard drive, a power supply, connectors).

Two heat generating components 106 (e.g., first heat generating component 106a and second heat generating component 106b) are shown in the example of FIG. 1. More or fewer heat generating components 106 may be included in the computing device 100. In one example, the heat generating component 106a is a processor and the heat generating component 106b is a graphics card. In other examples, one or more of the heat generating components 106a and 106b represent different components within the computing device 100 (e.g., a hard drive, a power supply, or another processor).

The thermal management system 102 includes one or more fans 110 (e.g., a fan) to actively cool the one or more heat generating components 106, respectively, moving heat out of the computing device 100 via inlet/outlets 112 of the one or more fans 110, vent 114 in the housing 104, vent 116 in the housing 104, or any combination thereof. The one or more fans 110 are in communication with at least one of the heat generating components 106 and/or another heat generating component. The one or more fans 110 may be any number of different types of fans including, for example, an axial-flow fan, a centrifugal fan, a crossflow fan, or another type of fan. The one or more fans 110 may rotate on any number of types of bearings including, for example, sleeve bearings, rifle bearings, ball bearings, fluid bearings, magnetic bearings, or another type of bearing. The one or more fans 110 may be sized and may rotate at a speed based on the heat generating component 106 to be cooled (e.g., based on the heat generated by the heat generating component 106 to be cooled). Each of the one or more fans 110 may be the same type of fan, or different types of fans may be used. While the example of FIG. 1 shows a single fan 110, the computing device 100 may include more fans 110.

The thermal management system 102 may include additional components (e.g., heat sinks and/or phase change devices) to aid in the removal of heat from the computing device 100. For example, the thermal management system 102 may include phase change devices (e.g., heat pipes and/or vapor chambers) physically attached or adjacent to a respective heat generating component 106 and a respective fan 110.

The thermal management system 102 also includes one or more sensors 118 that monitor operating conditions or parameters (e.g., an operating condition) on or in the computing device 100. The at least one heat generating component 106 and/or the other heat generating component is in communication with the one or more sensors 118. In one example, at least some of the one or more sensors 118 may be any number of different types of temperature sensors including, for example, a thermocouple, a resistance temperature detector (RTD) (e.g., a resistance wire RTD or a thermistor), or another type of temperature sensor. Alternatively or in addition, the one or more sensors 118 may include humidity sensors positioned at or adjacent to, for example, the inlet/outlets 112 of the one or more fans 110, the vent 114 in the housing 104, and/or the vent 116 in the housing 104, fan rotational speed sensors operable to measure speeds of the one or more fans 110, sensors (e.g., connectors) operable to identify connection of devices (e.g., an input device such as a keyboard) to the computing device, other types of sensors, or any combination thereof. In one example, at least one of the one or more sensors 118 is software or hardware that identifies usage of different components within the computing device 100 (e.g., CPU-centric and/or GPU-centric workflows). All of the one or more sensors 118 may be the same type of sensor, or different types of sensors may be used within the computing device 100.

As shown in the example of FIG. 1, the thermal management system 102 may include three sensors 118 (e.g., a first sensor 118a, a second sensor 118b, and a third sensor 118c). The first sensor 118a monitors a temperature corresponding to the first heat generating component 106a, the second sensor 118b monitors a temperature corresponding to the second heat generating component 106b, and the third sensor 118c monitors a rotational speed of the fan 110. For example, the first sensor 118a monitors an operating temperature of the first heat generating component 106a, and the second sensor 118b monitors an operating temperature of the second heat generating component 106b. The first sensor 118a, the second sensor 118b, and the third sensor 118c are positioned on or adjacent to the first heat generating component 106a, the second heat generating component 106b, and the fan 110, respectively. In one example, a sensor 118 monitors a temperature at a position within the computing device 100 not at or adjacent to one of the heat generating components 106. For example, the sensor 118 may monitor a temperature of a component of the thermal management system 102 (e.g., at a position on a phase change device such as a heat pipe) or a temperature on the housing 104.

All of the sensors 118 within the computing device 100 provide live closed-loop feedback to the thermal management system 102. For example, the thermal management system 102 includes a processor (e.g., one of the heat generating components 106, an EC, or another processor within or outside the computing device 100). The processor 106a, for example, receives the live temperatures from the sensors 118a and 118b and controls the fan 110 and/or the vents 114 and 116 based on the methods described below to increase airflow through the computing device and/or decrease system noise.

The example of FIG. 1 shows two vents. In other examples, the computing device 100 includes more or fewer vents. The processor of the thermal management system 102 is configured to open and close the vents 114 and 116 based on the operating condition monitored by the one or more sensors 118. For example, once the operating temperatures of the heat generating components 106a and 106b reach respective temperature limits and the fan 110 reaches a speed limit, the processor may open one or both of the vents 114 and 116 to increase airflow through the computing device 100 and/or decrease the fan speed of the fan 110 and thus decrease system noise.

In another example, as shown in FIG. 1, the vents 114 and 116 are located in positions within the housing 104 adjacent to the heat generating components 106a (e.g., the processor) and 106b (the GPU), respectively. The operating condition monitored by the one or more sensors 118 may be related to usage of the computing device 100. For example, the one or more sensors 118 may identify processor-centric (e.g., CPU-centric) workflows (e.g., with temperature measurements and/or processor speed measurement) and GPU-centric workflows (e.g., with temperature measurements and/or processor speed measurement). Processor-centric workflows may include, for example, image rendering, numerical simulation, deep learning, or any combination thereof. GPU-centric workflows may include, for example, graphically intensive games, video conferencing, other graphic-heavy applications, or any combination thereof. The processor of the thermal management system 102 may open one of the vents 114 and 116 based on the identified workflow.

For example, when the one or more sensors 118 identify a processor-centric workflow, the processor of the thermal management system 102 may open (see arrow 120) the vent 114 adjacent to the heat generating component 106a, such that the fan 110 moves more air (e.g., pushes or pulls air; see arrow 122) past the heat generating component 106a through the open vent 114. The processor of the thermal management system 102 may also close (see arrow 124) the vent 116 adjacent to the heat generating component 106b, such that the fan 110 moves less air (see arrow 126) past the heat generating component 106b. When the one or more sensors 118 identify a GPC-centric workflow, the processor of the thermal management system 102 may close the vent 114 and open the vent 116, such that the fan 110 moves more air past the heat generating component 106b through the open vent 116.

The vents 114 and 116 may be any number of different types of vents including, for example, single barriers and/or movable louvers. The vents 114 and 116 may open and close in any number of ways. For example, the vents 114 and 116 may be activated by rotating, sliding, and/or pivoting using mechanical or electromechanical mechanisms (e.g., mechanical linkages and a servo motor). In one example, the mechanisms for rotating, sliding, and/or pivoting the vents 114 and 116 may be thermally driven. For example, the mechanisms may be bi-metallic or made of shape memory alloys. The vents 114 may be any number of sizes and/or shapes. The vent 114, the vent 116, and/or any additional vents may be located in positions within the housing 104 different than the positions shown in FIG. 1.

The vent 114 and/or the vent 116 may be positioned on the housing 104 to minimally affect ID. In other words, the vent 114 and/or the vent 116 may be positioned on surfaces of the housing 104 the user of the computing device 100 or others viewing the computing device 100 cannot see when the computing device 100 is in operation and the vent 114 and/or the vent 116 is open. For example, the vent 114 and/or the vent 116 may be positioned on a bottom surface of the housing 104 positioned opposite a surface that supports the computing device 100.

Figure 2:
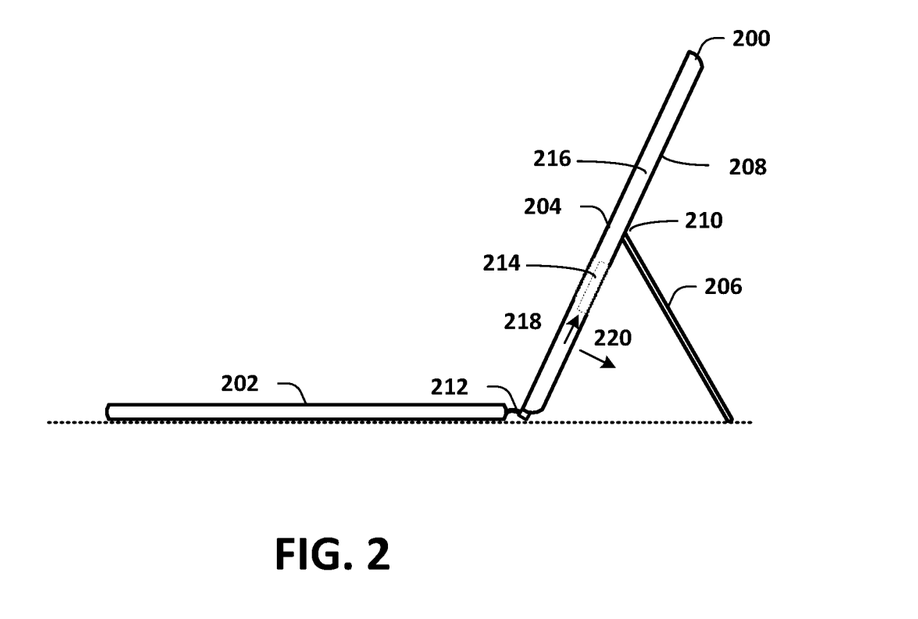
FIG. 2 depicts a side view of a computing device in a first configuration.
Figure 3:
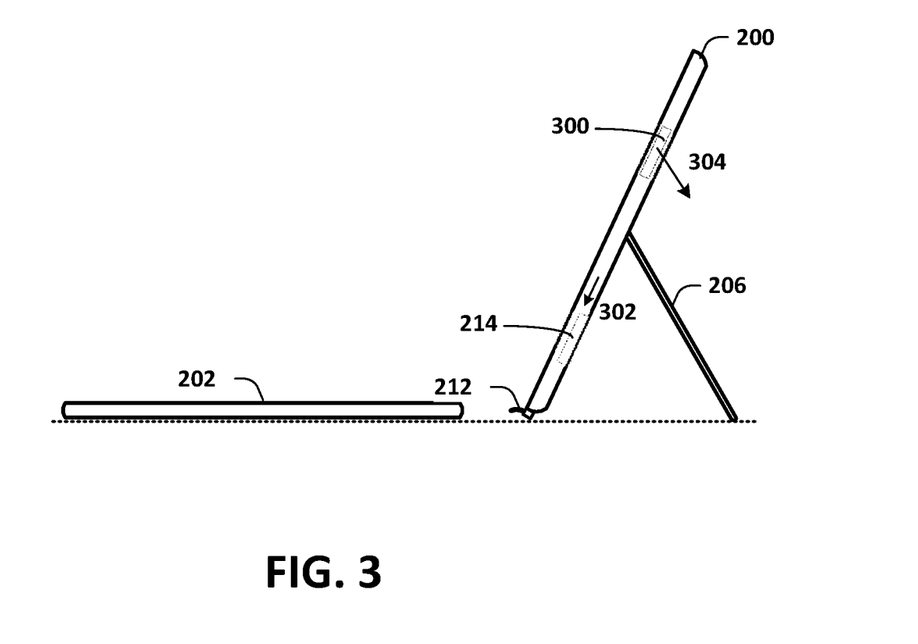
FIG. 3 depicts a side view of the computing device of FIG. 2 in a second configuration.

FIGS. 2 and 3 illustrate another example of positioning of vents and operation of the vents based on a monitored operating condition of a computing device 200. While implementations presented herein are discussed in the context of a tablet device, it is to be appreciated that various other types and form factors of devices may be utilized. Thus, the computing device 200 may range from full resource devices with substantial memory and processor resources, to a low-resource device with limited memory and/or processing resources. An example implementation of the computing device 200 is discussed below with reference to FIG. 8.

FIG. 2 shows a side view of the computing device 200 in a first configuration. In the illustrated example of FIG. 2, an input device 202 is configured as having an input portion that includes a keyboard having a QWERTY arrangement of keys and track pad, although other arrangements of keys may be provided. Other non-conventional configurations such as, for example, a game controller or a configuration to mimic a musical instrument may also be provided. Thus, the input device 202 and keys incorporated by the input device 202 may assume a variety of different configurations to support a variety of different functionality.

The computing device 200 further includes a display 204 and a support component 206. The display 204 is configured as a visual output functionality of the computing device 200. The support component 206 is rotatably and/or pivotally attached to a chassis or rear surface 208 of the computing device 200 via one or more hinges 210. For example, the support component 206 is pivotable via the one or more hinges 210 to different angles relative to the chassis or rear surface 208 to support different orientations of the computing device 200.

According to various examples, a variety of different orientations of the computing device 200 are supported. In the example shown in FIG. 2, the computing device 200 is physically and communicatively coupled to the input device 202 via a flexible hinge 212. A typing arrangement may be supported. In this orientation, the input device 202 is laid flat against a surface and the computing device 102 is disposed at an angle to permit viewing of the display 204 (e.g., such as through use of the support component 206 disposed on the chassis or rear surface 208 of the computing device 200. The described support component may be employed as a support component to enable a variety of different orientations for the computing device 200.

The computing device 200 includes at least a first vent 214 and a second vent (see FIG. 3). The first vent 214 is positioned at the rear surface 208, and the second vent is positioned at a side 216 of the computing device 200. In other examples, the computing device 200 includes more or fewer vents and/or vents located in different positions on the computing device 200.

When the input device 202 is physically and communicatively coupled to the computing device 200 via the flexible hinge 212, a sensor of the computing device 200 (e.g., a sensor that detects the physical connection, a sensor that detects an electrical connection, or the processor, which receives signals from the input device 202) detects the coupling. The processor may open (see arrow 218) the first vent 214 when the coupling between the input device 202 and the computing device 200 is detected. For ID purposes, the first vent 214 is at least partially hidden by the support component 206 when the computing device 200 is in the first configuration with the input device 202 coupled with the computing device 200 via the flexible hinge 212. Due to the location of the first vent 214 on the rear surface 208 of the computing device 200 (e.g., with a larger surface area than the side 216 of the computing device) and the first vent 214 being at least hidden by the support component 206, the first vent 214 may be larger than the second vent (see FIG. 3). With the input device 202 coupled to the computing device 200, a user may be more likely to position the computing device 200 and the input device 202 on a flat, hard surface (e.g., a surface of a table) than the lap of the user. The support component 206 places the rear surface 208 of the computing device 200 at a non-perpendicular angle relative to a surface that supports the computing device 200 and the input device 202 (e.g., the surface of the table or the lap of the user). Accordingly, even if the computing device 200 and the input device 202 are supported in the lap of the user in the first configuration, airflow (see arrow 220) out of the first vent 214 is not directly on the lap of the user.

FIG. 3 shows a side view of the computing device 200 in a second configuration. The computing device 200 is physically and communicatively decoupled from the input device 202. In the second configuration, with the computing device 200 physically and communicatively decoupled from the input device 202, the user may be more likely to use the computing device 200 in the lap of the user and less likely to use the computing device 200 on the surface of the table, for example. The sensor of the computing device 200 may detect the decoupling, and the processor of the computing device 200 may close (see arrow 302) the first vent 214 and/or open the second vent 300. Closing the support component 206 such that the computing device 200 may lay flat on the lap of the user blocks the first vent 214. The support component 206 may prevent hot air from leaving the computing device 200 out of the first vent 214 in such a configuration and may heat up the support component 206 and thus the lap of the user. Accordingly, in one example, the processor closes the first vent 214 and opens the second vent 300 when the sensor detects the decoupling between the input device 202 and the computing device 200. Air flows (see arrow 304) out of the computing device 200 via the second vent 300.

In one example, a sensor of the computing device 200 may monitor a rotational position of the display 204 relative to the input device 202. The processor of the computing device 200 may control the first vent 214 and/or the second vent 300 based on the monitored rotational position of the display 204 relative to the input device 202.

Figure 4:
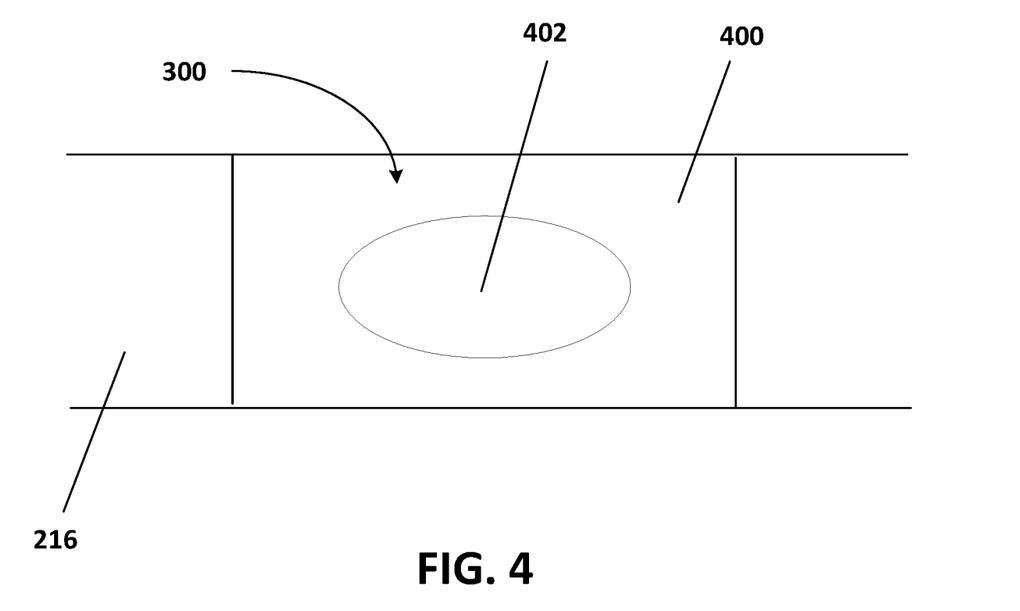
FIG. 4 depicts a front view of a vent in an open position.
Figure 5:
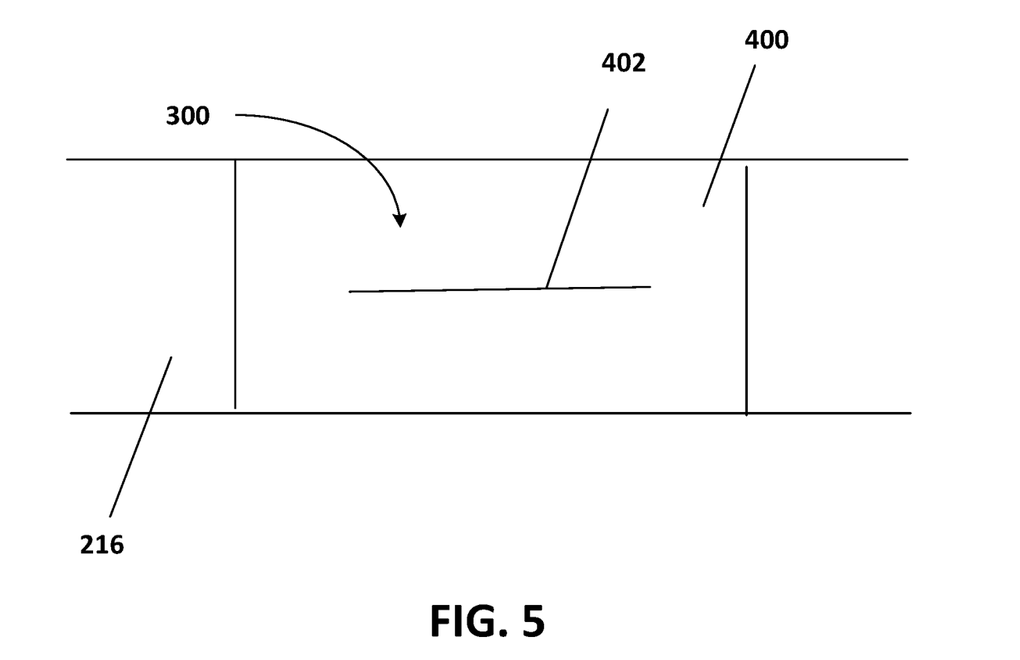
FIG. 5 depicts a front view of a vent in a closed position.

FIG. 4 shows an example of the second vent 300 in an open position, and FIG. 5 shows another example of the second vent 300 in a closed position. In the examples shown in FIGS. 4 and 5, at least a portion 400 of the side 216 of the computing device 200 is made of a thermally expandable material such as, for example, a bi-metallic or shape memory alloy (e.g., with a two-shape memory effect). For example, the portion 400 of the side 216 of the computing device 200 may include an opening 402 through the side 216 of the computing device 200 at a first temperature, and the opening 402 may close at a second temperature. In one example, the first temperature is greater than the second temperature. In other words, the opening 402 closes with decreasing temperature of the portion 400 of the side 216 of the computing device 200. In other examples, the opening closes with increasing temperature of the portion 400 of the side 216 of the computing device 200.

When the portion 400 of the side 216 of the computing device 200 is made of, for example, a shape memory alloy, the portion 400 of the side 216 of the computing device 200 remembers two different shapes, a first shape at low temperatures, and a second shape at higher temperatures. The shape memory alloy may be trained to remember the first shape and the second shape. The shape memory alloy may be copper-aluminum-nickel alloys or nickel-titanium alloys. Other alloys may be used. Thermally expandable materials may be used to open and/or close vents in other ways than illustrated in FIGS. 4 and 5.

As another example, rotational movement may be supported by the flexible hinge 212 such that the input device 202 may be placed against the display 204 of the computing device 200 and thereby act as a cover. Thus, the input device 202 may act to protect the display 204 of the computing device 200 from harm. A sensor of the computing device 200 (e.g., a camera of the computing device 200) may determine that the input device 202 has been folded via the flexible hinge 212 to act as the cover, and a processor of the computing device 200 may open or close the first vent 214, the second vent 300, other vents, or any combination thereof, respectively, within the computing device 200.

In other examples, sensors of the computing device 200 may monitor other operating parameters within the computing device 200, and a processor of the computing device 200 may operate the first vent 214, the second vent 300, and/or the other vents within the computing device 200. For example, sensors of the computing device may monitor operating parameters including, for example, a type of input device 202 coupled with the computing device 200, humidity at different locations within the computing device 200, workflows being executed by the computing device 200, operating temperatures within the computing device 200, and/or other operating parameters.

Figure 6:
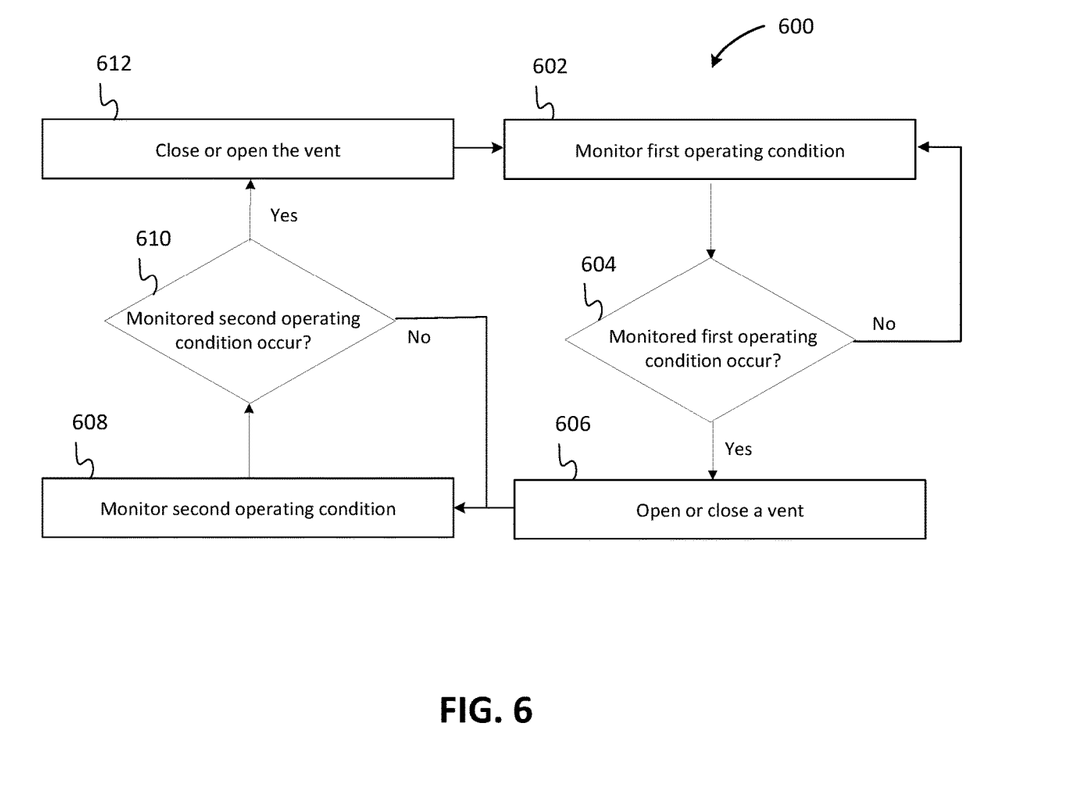
FIG. 6 is a flow diagram of a method for cooling an electronic device in accordance with one example.

FIG. 6 shows a flowchart of one example of a method 600 for cooling an electronic device. The electronic device may be a computing device shown in FIGS. 1-5 and/or FIG. 8, or may be another electronic device. The method 600 is implemented in the order shown, but other orders may be used. Additional, different, or fewer acts may be provided. Similar methods may be used for transferring heat.

In act 602, one or more sensors monitor a first operating condition (e.g., a configuration state and/or an operational state) of the electronic device (e.g., within or on the electronic device). The first operating condition may be any number of operating conditions within or on the electronic device. For example, the first operating condition may be an operational state related to a temperature in or on the electronic device (e.g., the housing the electronic device) or a humidity within the electronic device, or may be another operational state. Alternatively, the first operating condition may be a configuration state such as, for example, connection of one or more components (e.g., a keyboard) to the electronic device, a workflow being executed by the electronic device, or another configuration state.

In act 604, a processor determines whether the monitored first operating condition has occurred. For example, the one or more sensors are in communication with the processor, and the one or more sensors transmit signals related to the monitored first operating condition to the processor. If the processor determines that the monitored first operating condition has occurred, the method 600 moves to act 606. If the processor determines that the monitored first operating condition has not occurred, the method 600 returns to act 602 and the one or more sensors continue to monitor the first operating condition.

In one example, the first operating condition is related to a temperature within or on a housing of the electronic device. The one or more sensors measure the temperature and transmit data corresponding to the measured temperature to the processor. The one or more sensors transmit the data to the processor continuously or at predetermined intervals. In this example, the first operating condition is whether the measured temperature has reached or exceeded a first predetermined temperature (e.g., a maximum temperature for the housing of the electronic device).

In another example, the first operating condition is related to a humidity within the electronic device. The one or more sensors measure the humidity within the housing of the electronic device and transmit data corresponding to the measured humidity to the processor. The one or more sensors transmit the data to the processor continuously or at predetermined intervals. In this example, the first operating condition is whether the measured humidity has reached or exceeded a first predetermined humidity (e.g., a maximum humidity for proper operation of the electronic device).

In yet another example, the first operating condition is related to connection of one or more components to the electronic device. For example, the first operating condition is related to connection of a keyboard to the electronic device (e.g., a first configuration). The one or more sensors identify when the one or more components are connected to the electronic device. The one or more sensors transmit a signal identifying the connection of the one or more components to the electronic device. In this example, the first operating condition is whether the one or more components are physically and/or electrically connected to the electronic device.

In act 606, if the monitored first operating condition has occurred, the processor opens or closes a vent within the electronic device. The vent may be any number of different types of vents that open and close in different ways. For example, the vent may open and close with pivoting, sliding, rotating, and/or another motion. The vent may be any number of sizes and/or shapes, and the vent may be in any number of locations in or on the electronic device. For example, the vent may be through an outer surface (e.g., the housing) of the electronic device or may be between different portions within the electronic device. In one example, the housing of the electronic device includes two or more vents that remain open, and two or more vents within the electronic device (e.g., through walls within the electronic device dividing the electronic device into different portions) are openable and closable to divert airflow to the two or more vents in the housing, respectively.

In the example where the first operating condition is related to temperature, the processor opens the vent when the measured temperature has reached or exceeded the first predetermined temperature. By opening the vent when the measured temperature reaches or exceeds the first predetermined temperature, the system impedance for the electronic device is lowered and airflow through the electronic device is increased. The increased airflow through the electronic device aids in heat removal from the electronic device and may lower the temperature within or on the housing of the electronic device.

In the example where the first operating condition is related to humidity, the processor closes the vent when the measured humidity reaches or exceeds the first predetermined humidity. For example, the one or more sensors are positioned adjacent to the vent (e.g., outside or inside the electronic device), and the one or more sensors identify when air with too high a humidity is entering the electronic device through the vent. By closing the vent, the high humidity air is prevented from entering the electronic device. In one example, the processor opens one or more other vents through the electronic device, positioned at one or more distances away from the closed vent, respectively.

In the example where the first operating condition is related to the connection of one or more components, the processor opens or closes the vent based on the component that is identified as being connected to the electronic device. For example, when the one or more sensors identify that an input device such as a keyboard or a mouse has been physically and/or electrically connected to the electronic device, the processor opens the vent. The connection of the keyboard or the mouse to the electronic device may indicate that the electronic device is not being used on the lap on the user but on, for example, a surface of a table. In one example, the one or more sensors monitoring the connection of the one or more components may be used in conjunction with one or more sensors that monitor temperature on or in the electronic device to determine whether the electronic device is being used on a surface other than the lap of the user. In this example, the vent may be positioned on a back surface of the electronic device, and hot air moves out of the electronic device through the open vent in a direction away from the user.

In one example, at least a portion of the vent is made of a thermally expandable material such as, for example, a bi-metallic or shape memory alloy (e.g., with a two-shape memory effect). The vent may automatically open or close based on a temperature of the thermally expandable vent. For example, the portion of the vent made of the thermally expandable material expands with increasing temperature, such that the vent opens or closes with the increasing temperature.

In act 608, the one or more sensors or another sensor monitors a second operating condition. The second operating condition may be any number of operating conditions within or on the electronic device. For example, the second operating condition is related to the first operating condition or is different than the first operating condition. In one example, the second operating condition relates to a same predetermined value compared to the first operating condition.

In act 610, the processor determines whether the monitored second condition has occurred. For example, the one or more sensors are in communication with the processor, and the one or more sensors or the other sensor transmit a signal related to the monitored second operating condition to the processor. If the processor determines that the monitored second operating condition has occurred, the method 600 moves to act 612. If the processor determines that the monitored first operating condition has not occurred, the method 600 returns to act 608 and the one or more sensors continue to monitor the second operating condition.

In the example where the first operating condition is related to temperature, the second operating condition may be whether the measured temperature is below or has reached the first predetermined temperature (e.g., the maximum temperature for the housing of the electronic device). For example, the second operating condition is whether the measured temperature is below the maximum temperature for the housing of the electronic device after the vent has been opened. In other examples, the second condition is whether the measured temperature is below or has reached a second predetermined temperature. The second predetermined temperature may be less than the first predetermined temperature. In other words, the vent may stay open until the measured temperature reaches a predetermined temperature that is less than the maximum temperature for the housing of the electronic device.

In the example where the first operating condition is related to humidity, the second operating condition may be whether the measured humidity is below or has reached the first predetermined humidity (e.g., the maximum humidity for proper operation of the electronic device). For example, the second operating condition is whether the measured humidity is below the maximum humidity for proper operation of the electronic device after the vent has closed.

In the example where the first operating condition is related to the connection of the one or more components, the second operating condition may be whether the one or more components have been disconnected from the electronic device (e.g., a second configuration). The second operating condition may be whether the one or more components have been mechanically and/or electrically disconnected from the electronic device.

In act 612, the processor closes or opens the vent. In the example where the first operating condition is related to temperature, the processor closes the vent when the processor determines the monitored second operating condition has occurred. In the example where the first operating condition is related to humidity, the processor opens the vent when the processor determines the monitored second operating condition has occurred. In the example where the first operating condition is related to the connection of one or more components, the processor closes the vent when the processor determines the monitored second operating condition has occurred.

After act 612, the method returns to act 602, in which the first operating condition is monitored. The method 600 may be performed for different sensor/vent combinations within the electronic device in parallel. For example, a first vent of the electronic device may be opened or closed based on measurements from a temperature sensor in or on the electronic device, while a second vent may be opened or closed based on measurements from a humidity sensor in or on the electronic device. A single vent may be controlled based on measurements from different sensors, with the different controls having different ranks of importance. In other words, based on the method 600, if a temperature measurement indicates that the vent should be opened while a humidity measurement indicates that the vent should be closed, the processor opens the vent if the temperature control is identified as more important than the humidity control. The ranks of importance may vary based on corresponding values.

In one example, one or more sensors monitor a configuration state (e.g., whether a keyboard is electrically and/or physically connected) and an operational state (e.g., a temperature) at the same time. The processor controls the opening and/or closing of a single vent based on the monitored configuration state and the monitored operational state. Alternatively, the processor controls the opening and/or closing of at least two vents based on the monitored configuration state and the monitored operational state, respectively. For example, the processor may open the vent from a closed state to a first open state (e.g., a first state) based on the monitored configuration state, and may open the vent from the first open state to a second open state (e.g., a second state) or close the vent from the first open state to a third open state (e.g., a third state) based on the monitored operational state. In other examples, the processor may control the vent based on the monitored operational state before controlling the vent based on the monitored configuration state.

Figure 7:
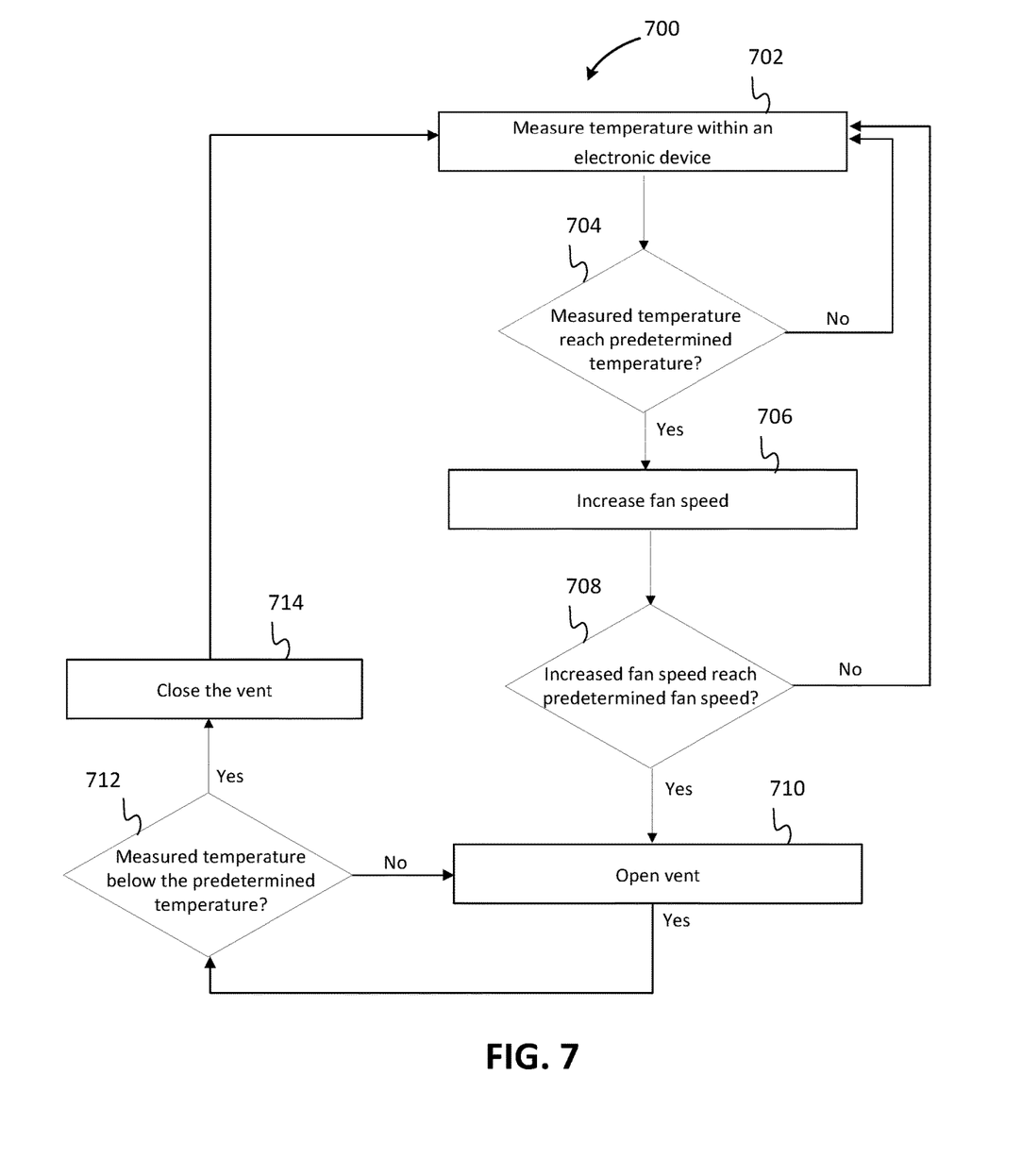
FIG. 7 is a flow diagram of a method for cooling an electronic device in accordance with another example.

FIG. 7 shows a flowchart of another example of a method 700 for cooling an electronic device. The method 700 is an example of a method for cooling an electronic device based on a monitored temperature on or within the electronic device. The electronic device may be a computing device shown in FIGS. 1-5 and/or FIG. 8, or may be another electronic device. The method 700 is implemented in the order shown, but other orders may be used. Additional, different, or fewer acts may be provided. Similar methods may be used for transferring heat.

In act 702, one or more sensors measure a temperature within or on the electronic device. The electronic device may be any number of electronic devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The electronic device includes one or more heat generating devices to be cooled. For example, the one or more heat generating devices may be any number of electrically powered devices including, for example, a processor, memory, a power supply, a graphics card, a hard drive, or another electrically powered device. The electronic device may also include one or more fans to actively cool the electronic device. In one example, the electronic device does not include any fans.

In one example, the one or more sensors include at least three sensors (e.g., two temperature sensors and a fan sensor), the one or more heat generating devices include at least two heat generating devices (e.g., a first heat generating device and a second heat generating device), and the one or more fans include a fan. In one example, each sensor of the two temperature sensors is positioned at or adjacent to a respective one of the two heat generating devices. For example, the temperature sensor physically contacts the respective heat generating device or physically contacts another component (e.g., a heat sink) in physical contact with the heat generating device. The two temperature sensors monitor temperature continuously or at intervals (e.g., predetermined intervals). The fan sensor is in communication with the fan and monitors fan speed of the fan. The fan sensor monitors the fan speed of the fan continuously or at intervals (e.g., predetermined intervals). In another example, at least one of the two temperature sensors is positioned at an expected hot spot of the electronic device and is not associated with a heat generating component (e.g., on a housing of the electronic device to monitor housing temperatures experienced by a user).

In one example, at least one of the heat generating devices is a processor. In another example, none of the heat generating devices is the processor (e.g., the processor is located outside the electronic device, and data is transmitted from/to the sensors to/from the processor via a wired and/or wireless connection). The processor may be configured by hardware, software, firmware, or any combination thereof.

In act 704, a processor determines whether the measured temperature reaches or exceeds (e.g., is greater than, or greater than or equal to) a predetermined temperature. The predetermined temperature may be a maximum temperature on a housing of the electronic device, a temperature at or adjacent to a heat generating device within the electronic device, or another temperature in or on the electronic device. The predetermined temperature may be stored in a memory in communication with the processor (e.g., a memory within the electronic device). The processor compares the measured temperature to the predetermined temperature, and if the measured temperature reaches or exceeds the predetermined temperature, the method 700 moves to act 706. If the measured temperature has not reached or exceeded the predetermined temperature, the method returns to act 702, where the one or more sensors continue to monitor the temperature within or on the electronic device.

In act 706, the processor increases a fan speed. The electronic device may include one or more fans. The processor may increase the fan speed of at least one fan of the one or more fans. In one example, the processor increases the fan speed of all fans of the one or more fans. Each fan of the one or more fans may be associated with at least one sensor within the electronic device. For example, a first sensor may be associated with a first heat generating device within the electronic device, and a first fan may be associated with the first sensor. In other words, the first fan is positioned within the electronic device to most effectively cool the first heat generating device, operating temperatures of which are measured by the first sensor.

In act 708, the processor determines whether the increased fan speed reaches or exceeds (e.g., is greater than, or greater than or equal to) a predetermined fan speed. The predetermined fan speed may be a maximum fan speed for acoustic purposes. In other words, the predetermined fan speed may correspond to the greatest fan speed at which acoustic levels are acceptable. The predetermined fan speed may be stored in a memory in communication with the processor (e.g., the memory within the electronic device). The processor compares the increased fan speed from act 706 to the predetermined fan speed, and if the increased fan speed reaches or exceeds the predetermined fan speed, the method 700 moves to act 710. If the measured fan speed has not reached or exceeded the predetermined fan speed, the method returns to act 702, where the one or more sensors continue to monitor the temperature within or on the electronic device.

In act 710, the processor opens a vent within the electronic device. The vent may correspond to the one or more sensors used to measure the temperature in act 702. For example, the vent may be a vent closest to the one or more sensors and/or may be a vent controlled to increase airflow past the one or more sensors. In one example, the processor may close one or more vents when the vent is opened in act 710, such that a larger airflow is directed past the one or more sensors (e.g., a heat generating device or a housing surface on which the one or more sensors are disposed).

In one example, the processor decreases the fan speed when the vent is opened. The vent being open decreases system impedance, thus increasing airflow through the electronic device. The increased airflow may decrease the measured temperature, allowing for fan speed to be decreased. The decreased fan speed may decrease system acoustics.

In act 712, the processor determines whether the measured temperature reaches or is below (e.g., is less than, or less than or equal to) the predetermined temperature. As the one or more sensors monitor the temperature continuously or at predetermined intervals, the measured temperature in act 712 (e.g., at a second time point) may be different than the measured temperature at act 704 (e.g., at a first time point). If the measured temperature is below the predetermined temperature, the method 700 moves to act 714. If the measured temperature is not below the predetermined temperature, the method 700 moves to act 710, and the vent remains open.

In one example, the processor determines whether the measured temperature reaches or is below a second predetermined temperature. The second predetermined temperature may be less than the first predetermined temperature. In other words, the vent may remain open until the measured temperature is much cooler (e.g., 10 C cooler) than the maximum temperature on the housing, for example.

In act 714, the processor closes the vent. In one example, the processor opens one or more other vents within the electronic device when the vent is closed in act 714. After act 714, the method 700 returns to act 702 where the one or more sensors continue to monitor the temperature within the electronic device.

In one example, the vent is never closed but is in different states of open. For example, before act 710, the vent is open in a first open state; in act 710, the vent is opened further (e.g., a second open state), such that an opening through the vent is larger compared to before act 710 is performed. In act 714, the vent is closed but not completely closed; the vent is closed, such that the opening through the vent (e.g., the first open state) is smaller compared to before act 714 and after act 710 (e.g., the second open state). The second open state of the vent may be the vent entirely opened or less than entirely opened.

The examples of the method described with reference to FIG. 7 may provide optimal thermal management while minimizing system acoustics in electronic devices. Optimal thermal management may provide an increase in system performance, an increase in system and/or device life expectancy, and an improved financial margin.

Figure 8:
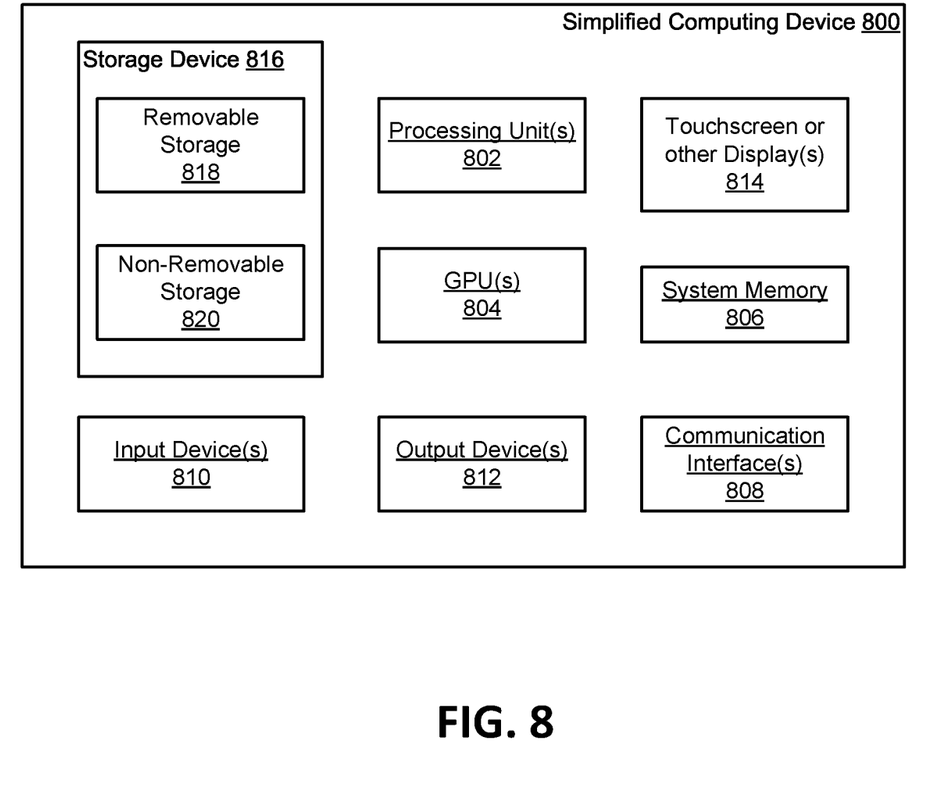
FIG. 8 is a block diagram of a computing environment in accordance with one example for implementation of the disclosed methods or one or more electronic devices.

With reference to FIG. 8, a thermal management system, as described above, may be incorporated within an exemplary computing environment 800. The computing environment 800 may correspond with one of a wide variety of computing devices, including, but not limited to, personal computers (PCs), server computers, tablet and other hand-held computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fans).

The computing environment 800 has sufficient computational capability and system memory to enable basic computational operations. In this example, the computing environment 800 includes one or more processing units 802, which may be individually or collectively referred to herein as a processor. The computing environment 800 may also include one or more graphics processing units (GPUs) 804. The processor 802 and/or the GPU 804 may include integrated memory and/or be in communication with system memory 806. The processor 802 and/or the GPU 804 may be a specialized microprocessor, such as a digital signal processor (DSP), a very long instruction word (VLIW) processor, or other microcontroller, or may be a general purpose central processing unit (CPU) having one or more processing cores. The processor 802, the GPU 804, the system memory 806, and/or any other components of the computing environment 800 may be packaged or otherwise integrated as a system on a chip (SoC), application-specific integrated circuit (ASIC), or other integrated circuit or system.

The computing environment 800 may also include other components, such as, for example, a communications interface 808. One or more computer input devices 810 (e.g., pointing devices, keyboards, audio input devices, video input devices, haptic input devices, or devices for receiving wired or wireless data transmissions) may be provided. The input devices 810 may include one or more touch-sensitive surfaces, such as track pads. Various output devices 812, including touchscreen or touch-sensitive display(s) 814, may also be provided. The output devices 812 may include a variety of different audio output devices, video output devices, and/or devices for transmitting wired or wireless data transmissions.

The computing environment 800 may also include a variety of computer readable media for storage of information such as computer-readable or computer-executable instructions, data structures, program modules, or other data. Computer readable media may be any available media accessible via storage devices 816 and includes both volatile and nonvolatile media, whether in removable storage 818 and/or non-removable storage 820. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 800.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a method for cooling an electronic device is provided. The electronic device includes a housing and a vent in the housing. The method includes monitoring a configuration state of the electronic device. The method also includes opening or closing, by a processor, the vent based on the monitored configuration state of the electronic device.

In a second embodiment, with reference to the first embodiment, the method further includes monitoring an operational state of the electronic device. Opening or closing the vent includes opening or closing, by the processor, the vent based on the monitored configuration state of the electronic device and the monitored operational state of the electronic device.

In a third embodiment, with reference to the second embodiment, monitoring the operational state of the electronic device includes measuring, by a sensor, a temperature within the electronic device. The method further includes comparing, by the processor, the measured temperature to a predetermined temperature. The method also includes opening or closing the vent or another vent when the measured temperature is greater than, or greater than or equal to the predetermined temperature.

In a fourth embodiment, with reference to the third embodiment, measuring the temperature within the electronic device includes measuring the temperature within the electronic device at a first time point. The predetermined temperature is a first predetermined temperature. After the opening or the closing of the vent, the method further includes measuring, by the sensor, the temperature at a second time point, and closing or opening the vent or the other vent when the measured temperature at the second time point is less than, or less than or equal to a second predetermined temperature.

In a fifth embodiment, with reference to the third embodiment, opening or closing the vent or the other vent when the measured temperature is greater than, or greater than or equal to the predetermined temperature includes opening the vent from a first state to a second state or closing the vent from the first state to a third state when the measured temperature is greater than, or greater than or equal to the predetermined temperature. The vent is in the first state after the vent is opened or closed based on the monitored configuration state of the electronic device.

In a sixth embodiment, with reference to the third embodiment, opening or closing the vent based on the monitored configuration state includes opening the vent from a first open state to a second open state or closing the vent from the second open state to the first open state.

In a seventh embodiment, with reference to the first embodiment, monitoring the configuration state of the electronic device includes determining whether an input device is physically, electrically, or physically and electrically connected to the electronic device, determining whether the electronic device is executing a GPU-centric workflow or a CPU-centric workflow, determining a position of a display of the electronic device relative to a chassis of the electronic device, or a combination thereof.

In an eighth embodiment, with reference to the first embodiment, at least a portion of the vent is made of an expandable material. Opening or closing the vent based on the monitored configuration state of the electronic device includes the portion of the vent made of the expandable material expanding with increasing temperature, such that the vent opens or closes with the increasing temperature.

In a ninth embodiment, with reference to the first embodiment, the vent is a first vent, and the electronic device further includes a second vent. Opening or closing the first vent based on the monitored configuration state of the electronic device includes opening the first vent based on the monitored configuration state of the electronic device. The method further includes closing the second vent based on the monitored configuration state of the electronic device as the first vent is opened.

In a tenth embodiment, a method for cooling a computing device is provided. The computing device includes a housing, a sensor within or on the housing, a fan supported by the housing, and a vent on the housing that is openable and closeable. The method includes measuring, by the sensor, a temperature within or on the housing. A processor compares the measured temperature to a predetermined temperature. The method also includes increasing a speed of the fan based on the comparison of the measured temperature to the predetermined temperature. The processor compares the increased speed of the fan to a predetermined fan speed. The method includes opening the vent based on the comparison of the increased speed of the fan to the predetermined fan speed.

In an eleventh embodiment, with reference to the tenth embodiment, increasing the speed of the fan based on the comparison of the measured temperature to the predetermined temperature includes increasing the speed of the fan when the measured temperature is greater than, or greater than or equal to the predetermined temperature.

In a twelfth embodiment, with reference to the tenth embodiment, opening the vent based on the comparison of the increased speed of the fan to the predetermined fan speed includes opening the vent when the increased speed of the fan is greater than or greater than or equal to the predetermined fan speed.

In a thirteenth embodiment, with reference to the tenth embodiment, measuring the temperature within or on the housing includes continuously measuring the temperature or measuring the temperature at a predetermined interval. The comparing of the measured temperature to the predetermined temperatures includes comparing the measured temperature at a first time point to a predetermined temperature. The method further includes comparing the measured temperature at the second time point to the predetermined temperature after the opening of the vent. The method includes closing the vent based on the comparison of the measured temperature at the second time point to the predetermined temperature.

In a fourteenth embodiment, with reference to the thirteenth embodiment, closing the vent based on the comparison of the measured temperature at the second time point to the predetermined temperature includes closing the vent when the measured temperature at the second time point is less than, or less than or equal to the predetermined temperature.

In a fifteenth embodiment, a computing device includes a housing including a vent. The computing device also includes a sensor configured to determine a configuration state of the computing device. The computing device also includes a processor in communication with the sensor. The processor is configured to open or close the vent of the housing based on the determined configuration state of the computing device.

In a sixteenth embodiment, with reference to the fifteenth embodiment, the sensor is a first sensor. The computing device further includes a fan supported by the housing, and a second sensor that is a temperature sensor configured to measure a temperature within or on the housing. The processor is in communication with the fan and the second sensor. The processor is configured to compare the measured temperature to a predetermined temperature. The processor is also configured to increase a speed of the fan based on the comparison of the measured temperature to the predetermined temperature. The processor is configured to compare the increased speed of the fan to a predetermined fan speed, and open the vent or another vent based on the comparison of the increased speed of the fan to the predetermined fan speed.

In a seventeenth embodiment, with reference to the sixteenth embodiment, the measured temperature is a first measured temperature at a first time point, and the predetermined temperature is a first predetermined temperature. The second sensor is configured to measure a second temperature within or on the housing at a second time point. The second time point is after the vent is opened. The processor is further configured to compare the second measured temperature to the first predetermined temperature or a second predetermined temperature, and close the vent or the other vent based on the comparison of the second measured temperature to the first predetermined temperature or the second predetermined temperature.

In an eighteenth embodiment, with reference to the fifteenth embodiment, the vent is a first vent. The housing further includes a second vent. The configuration state is whether an input device is physically, electrically, or physically and electrically connected to the housing. The processor is further configured to open the first vent and close the second vent when the input device is physically, electrically, or physically and electrically connected to the housing. The processor is configured to close the first vent and open the second vent when the input device is not physically, electrically, or physically and electrically connected to the housing.

In a nineteenth embodiment, with reference to the fifteenth embodiment, at least part of the vent is made of a thermally expandable material.

In a twentieth embodiment, with reference to the nineteenth embodiment, the thermally expandable material of the vent is configured to close the vent or open the vent as a temperature of the vent increases from a first temperature to a second temperature.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A method for cooling an electronic device, the electronic device comprising a housing, a CPU, a GPU, and a vent in the housing, the method comprising:
   monitoring a configuration state of the electronic device including determining if the electronic device is executing a GPU-centric workflow or CPU-centric workflow based on processor usage information;
   after monitoring the configuration state of the electronic device, opening or closing, by a processor, the vent based on the determined GPU-centric workflow configuration states of the electronic device; and
   after monitoring the configuration state of the electronic device, opening or closing, by a processor, the vent based on the determined CPU-centric workflow configuration states of the electronic device.

2. The method of claim 1, wherein opening or closing the vent based on the monitored configuration state comprises opening the vent from a first open state to a second open state or closing the vent from the second open state to the first open state.

3. The method of claim 1, wherein at least a portion of the vent is made of an expandable material, and
   wherein opening or closing the vent based on the monitored configuration state of the electronic device comprises the portion of the vent made of the expandable material expanding with increasing temperature, such that the vent opens or closes with the increasing temperature.

4. The method of claim 1, wherein the vent is a first vent, and the electronic device further comprises a second vent,
   wherein opening or closing the first vent based on the monitored configuration state of the electronic device comprises opening the first vent based on the monitored configuration state of the electronic device, and
   wherein the method further comprises closing the second vent based on the monitored configuration state of the electronic device as the first vent is opened.

5. The method of claim 1, wherein the electronic device is a computing device, the computing device comprising a housing, a sensor within or on the housing, a fan supported by the housing, and a vent on the housing that is openable and closeable, wherein the configuration state includes a temperature within the housing or a speed of the fan the method further comprising:
   wherein monitoring the configuration state of the electronic device further comprises:
      measuring, by the sensor, the temperature within or on the housing;
      comparing, by a processor, the measured temperature to a predetermined temperature;
      increasing the speed of the fan based on the comparison of the measured temperature to the predetermined temperature;
      comparing, by the processor, the increased speed of the fan to a predetermined fan speed;
   wherein opening or closing, by a processor, the vent based on the monitored configuration state of the electronic device further comprises:
      opening the vent based on the comparison of the increased speed of the fan to the predetermined fan speed.

6. The method of claim 5, wherein increasing the speed of the fan based on the comparison of the measured temperature to the predetermined temperature comprises increasing the speed of the fan when the measured temperature is greater than, or greater than or equal to the predetermined temperature.

7. The method of claim 5, wherein opening the vent based on the comparison of the increased speed of the fan to the predetermined fan speed comprises opening the vent when the increased speed of the fan is greater than or greater than or equal to the predetermined fan speed.

8. The method of claim 5, wherein measuring the temperature within or on the housing comprises continuously measuring the temperature or measuring the temperature at a predetermined interval, the comparing of the measured temperature to the predetermined temperature comprising comparing the measured temperature at a first time point to the predetermined temperature, and
   wherein the method further comprises:
      comparing the measured temperature at a second time point to the predetermined temperature after the opening of the vent;
      closing the vent based on the comparison of the measured temperature at the second time point to the predetermined temperature.

9. The method of claim 8, wherein closing the vent based on the comparison of the measured temperature at the second time point to the predetermined temperature comprises closing the vent when the measured temperature at the second time point is less than, or less than or equal to the predetermined temperature.

10. The method of claim 1, wherein monitoring the configuration state of the electronic device comprises determining whether an input device is both physically and electrically connected to the electronic device.

11. The method of claim 10, wherein the input device is a keyboard.

12. The method of claim 1, the vent further comprising a first vent and a second vent and wherein opening or closing, by a processor, the vent based on the determined GPU-centric workflow configuration states of the electronic device further comprises opening or closing, by a processor, the first vent based on the determined GPU-centric workflow configuration states of the electronic device, and wherein opening or closing, by a processor, the vent based on the determined CPU-centric workflow configuration states of the electronic device further comprises opening or closing, by a processor, the first vent based on the determined CPU-centric workflow configuration states of the electronic device.

13. The method of claim 1, wherein the processor usage information includes processor speed measurements.

14. A method for cooling an electronic device, the electronic device comprising a housing, a sensor, and a vent in the housing, the method comprising:
   monitoring a configuration state of the electronic device including determining a rotational position of a display of the electronic device relative to an input device using the sensor; and
   opening or closing, by a processor, the vent based on the sensor determined relative rotational position of the display.

15. The method of claim 14, wherein the input device is a detachable keyboard.

16. The method of claim 14, wherein the relative position is an angle sufficiently large to permit viewing of the display.

* * * * *